United States Patent
Otsuka et al.

(10) Patent No.: US 7,280,385 B2
(45) Date of Patent: Oct. 9, 2007

(54) SEMICONDUCTOR MEMORY DEVICE

(75) Inventors: Kanji Otsuka, 2-1074-38, Kohan, Higashiyamato-shi, Tokyo (JP); Tamotsu Usami, 2-38-4, Nishimachi, Kokubunji-shi, Tokyo (JP)

(73) Assignees: Kabushiki Kaisha Toshiba, Tokyo (JP); Kanji Otsuka, Tokyo (JP); Tamotsu Usami, Tokyo (JP); Oki Electric Industry Co., Ltd., Tokyo (JP); Sanyo Electric Co., Ltd., Osaka (JP); Sharp Kabushiki Kaisha, Osaka (JP); Sony Corporation, Tokyo (JP); NEC Corporation, Tokyo (JP); Fujitsu Limited, Kanagawa (JP); Matsushita Electric Industrial Co., Ltd., Osaka (JP); Renesas Technology Corp., Tokyo (JP); Rohm Co., Ltd., Kyoto (JP)

( * ) Notice: Subject to any disclaimer, the term of this patent is extended or adjusted under 35 U.S.C. 154(b) by 86 days.

(21) Appl. No.: 11/360,681

(22) Filed: Feb. 24, 2006

(65) Prior Publication Data

US 2006/0203586 A1 Sep. 14, 2006

(30) Foreign Application Priority Data

Feb. 25, 2005 (JP) ............................. 2005-050632

(51) Int. Cl.
*G11C 11/24* (2006.01)
(52) U.S. Cl. ....................................... 365/149; 365/207
(58) Field of Classification Search ................ 365/149, 365/207, 205
See application file for complete search history.

(56) References Cited

U.S. PATENT DOCUMENTS

| | | | |
|---|---|---|---|
| 6,504,741 B2 * | 1/2003 | Ema ............................. | 365/49 |
| 6,731,153 B2 | 5/2004 | Otsuka et al. | |
| 6,845,033 B2 * | 1/2005 | Kirihata et al. ............. | 365/149 |
| 2003/0193824 A1 * | 10/2003 | Tsukikawa et al. ......... | 365/149 |

FOREIGN PATENT DOCUMENTS

JP 2002-124635 4/2002

OTHER PUBLICATIONS

Bunch, R. L. et al., "Large-Signal Analysis of MOS Varactors in CMOS -$G_m$ LC VCOs," IEEE Journal of Solid-State Circuits, vol. 38, No. 8, pp. 1325-1332, (Aug. 2003).
Yang, B. D. et al., "A Low-Power Charge-Recycling ROM Architecture," IEEE Transactions of Very Large Scale Integration (VLSI) Systems, vol. 11, No. 4, pp. 590-600, (Aug. 2003).

(Continued)

*Primary Examiner*—Anh Phung
(74) *Attorney, Agent, or Firm*—Finnegan, Henderson, Farabow, Garrett & Dunner, L.L.P.

(57) ABSTRACT

A memory cell MC includes nMOS transistors for a transfer gate configured to be paired with each other, and one capacitor for data storage connected to the nMOS transistor. A gate electrode of the nMOS transistor is connected to a word line WL, and a drain is connected to a bit line BL. A gate electrode of the nMOS transistor is connected to a word line /WL, and a drain and a source are connected to a ground. The capacitor is connected between a source of the nMOS transistor and the ground. A Y selector circuit is connected between a differential bit line BL, /BL and a differential data line DL, /DL. The Y selector circuit has two pairs of nMOS transistors configured to be paired transistors, respectively.

11 Claims, 7 Drawing Sheets

OTHER PUBLICATIONS

Koh, K. J. et al., "Subharmonically Pumped CMOS Frequency Conversion (Up and Down) Circuits for 2-GHz WCDMA Direct-Conversion Transceiver," IEEE Journal of Solid-State Circuits, vol. 39, No. 6, pp. 871-884, (Jun. 2004).

* cited by examiner

Stacked paired lines

Paired coplanar lines

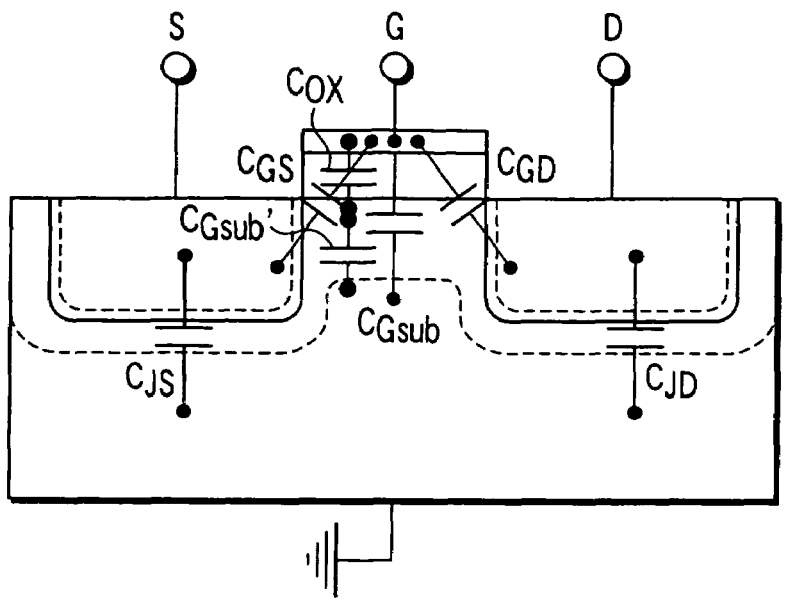
F I G. 5A
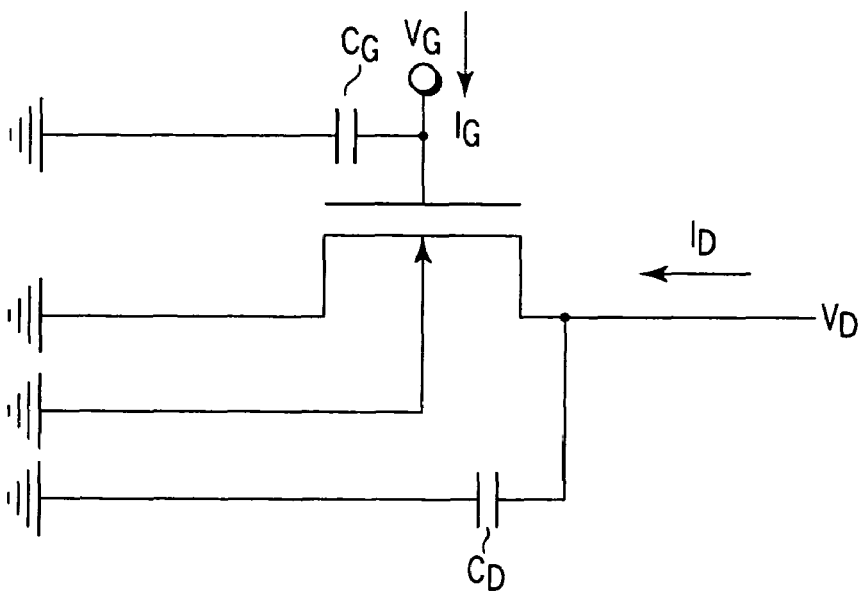
F I G. 5B
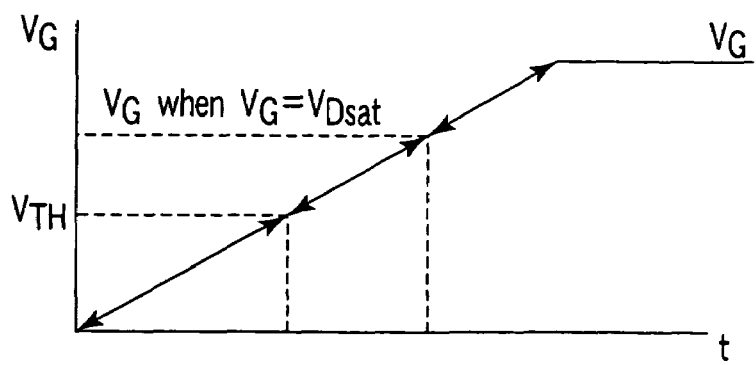
F I G. 6

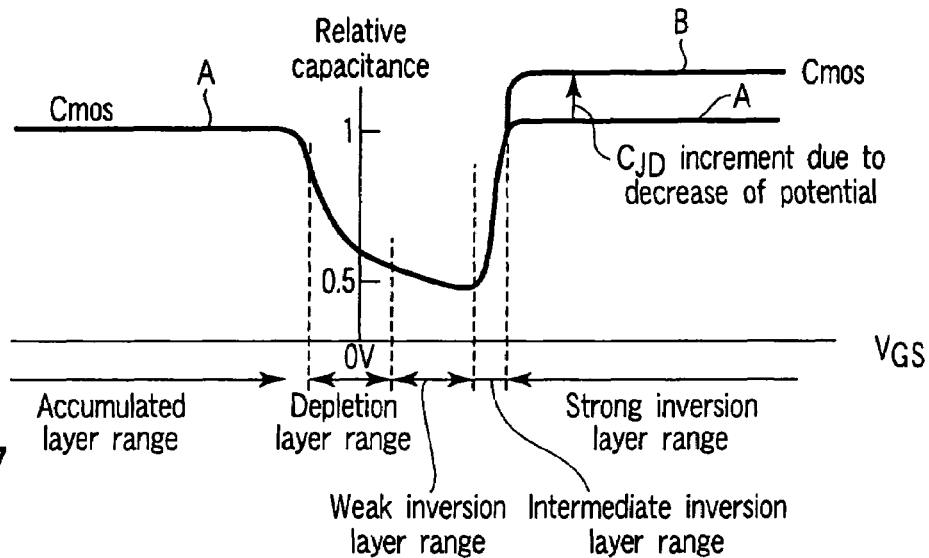
FIG. 7
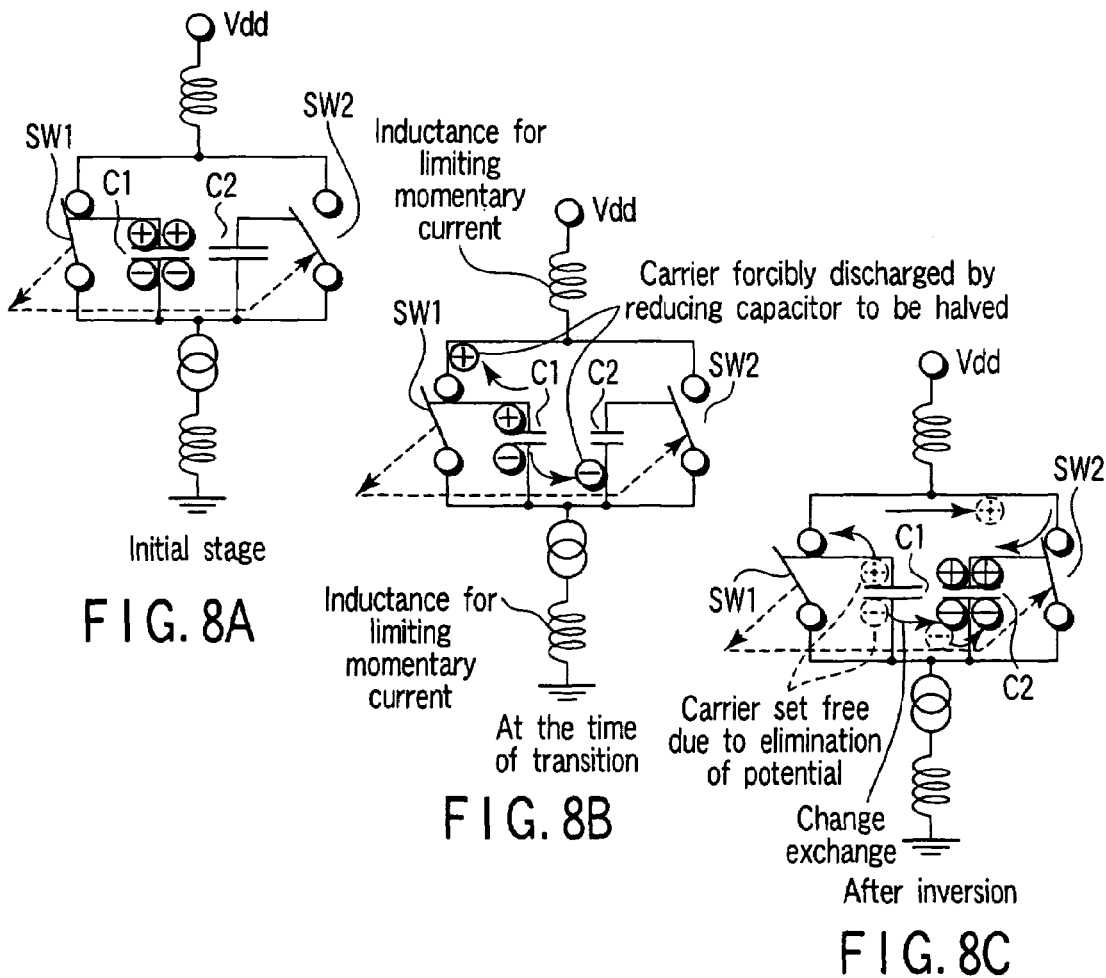
FIG. 8A  Initial stage
FIG. 8B  At the time of transition
FIG. 8C  After inversion

SEMICONDUCTOR MEMORY DEVICE

CROSS-REFERENCE TO RELATED APPLICATIONS

This application is based upon and claims the benefit of priority from prior Japanese Patent Application No. 2005-050632, filed Feb. 25, 2005, the entire contents of which are incorporated herein by reference.

BACKGROUND OF THE INVENTION

1. Field of the Invention

The present invention relates to a semiconductor memory device such as a dynamic random access memory (DRAAM) or a static random access memory (SRAM), and particularly, to a semiconductor memory device capable of achieving a high speed operation.

2. Description of the Related Art

In a semiconductor memory device such as a DRAM or an SRAM, a signal is transmitted in a memory mat at a comparatively long distance of a word line and a bit line. Therefore, a timing margin caused by an RC delay in the word line and bit line must be significantly taken. When a line such as the word line or bit line is regarded as a transmission line, this line is released from the RC delay, and a signal delay is obtained as only a delay caused by an electromagnetic wave speed. In general, a timing margin which is equal to or greater than 10 times a conventional margin can be allocated.

Gate electrodes of a number of transistors are connected to word lines, and sources of a number of transistors are connected to bit lines. Every time the signal states of the word line and bit line are inverted, a charge is pulled out by a gate capacitance or a source dispersion capacitance of a transistor. Losing signal energy (total amount of charge) flowing through the word line and bit line results in an RC delay, and a high speed operation is inhibited. Jpn. Pat. Appln. KOKAI Publication No. 2002-124635 describes that high speed switching of a transistor is achieved by providing a circuit for forcibly pumping up and pumping down a charge required for state transition of the transistor.

BRIEF SUMMARY OF THE INVENTION

According to one aspect of the present invention, there is provided a semiconductor memory device comprising: memory cells having at least a pair of paired transistors connected to a word line and a bit line, the paired transistors being formed in a same well region so as to be adjacent to each other, and operating in a differential manner; and a sense amplifier circuit having at least a pair of paired transistors connected to the bit line, the paired transistors being formed in a same well region so as to be adjacent to each other, and operating in a differential manner.

BRIEF DESCRIPTION OF THE SEVERAL VIEWS OF THE DRAWING

FIG. 5A is a sectional view showing an element structure of an nMOS transistor;

FIG. 5B is a diagram showing a symbol of an n-MOS transistor;

FIG. 6 is characteristic view showing a change of an effective capacitance with respect to a gate voltage of an MOS transistor;

FIG. 7 is a characteristic view showing an effective capacitance in a variety of gate voltage ranges in an MOS transistor;

FIGS. 8A to 8C are diagrams each showing a circuit model to be used for illustrating an operation of paired transistors;

DETAILED DESCRIPTION OF THE INVENTION

First Embodiment

Figure 1:
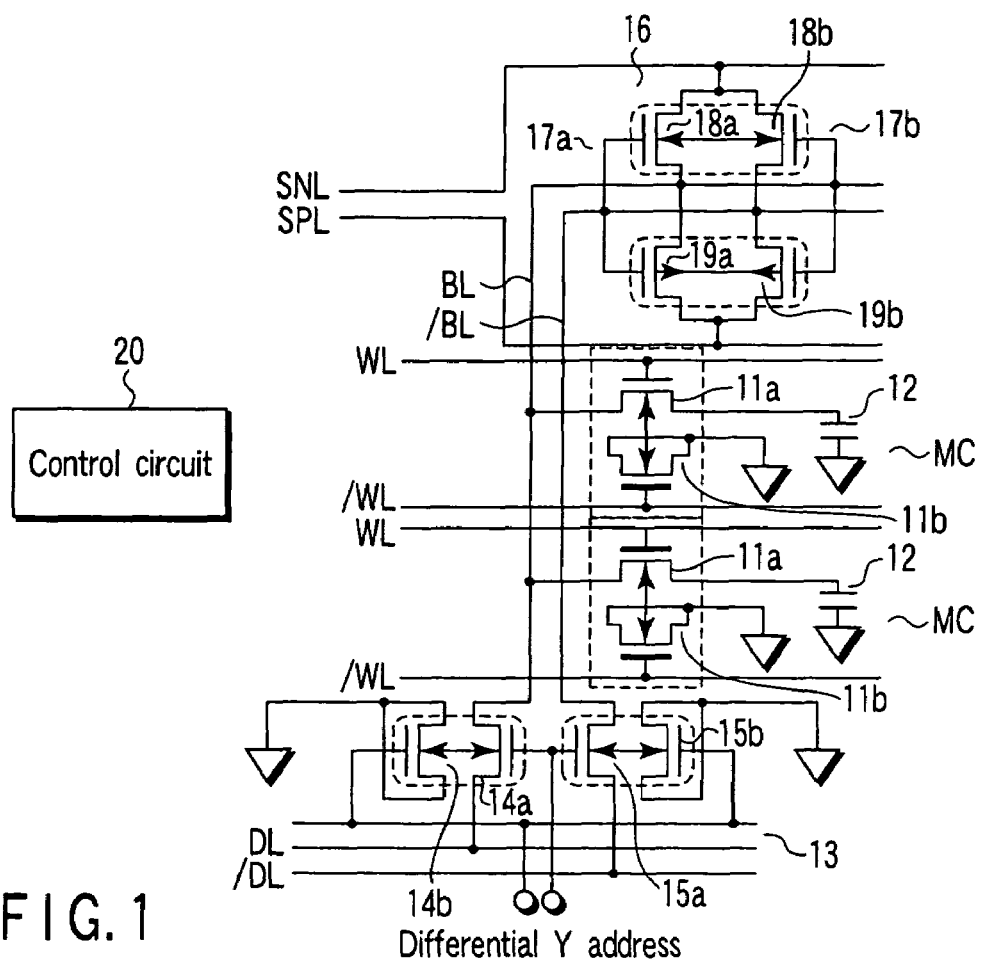
FIG. 1 is a circuit diagram showing a DRAM according to a first embodiment.

FIG. 1 is a circuit diagram showing a DRAM according to a first embodiment. In the figure, WL and /WL denote differential word lines, and BL and /BL denote differential bit lines. Memory cells MC are allocated to cross points of the differential word lines WL and /WL and the differential bit lines BL and /BL, respectively. The memory cells MC are connected to the corresponding word lines WL and /WL and differential bit lines BL and /BL, respectively.

In this embodiment, each memory cell MC includes nMOS transistors 11a and 11b for a transfer gate constituting paired transistors, and one capacitor 12 for data storage connected to one nMOS transistor 11a of the nMOS transistors 11a and 11b.

A gate electrode of the nMOS transistor 11a in the memory cell MC is connected to one word line WL of the differential word lines, and a drain of the nMOS transistor 11a is connected to one bit line BL of the differential bit lines. The capacitor 12 is connected between a source of the nMOS transistor 11a and a ground. A gate electrode of the other nMOS transistor 11b is connected to the other word line /WL of the differential word lines, and a drain and a source of the nMOS transistor 11b are connected to a ground altogether.

A Y selector circuit (column selector circuit) 13 is connected between the differential bit line BL, /BL and a differential data line DL, /DL. The Y selector circuit 13 has two pairs of nMOS transistors 14a, 14b and 15a, 15b configured to be paired transistors, respectively.

A source-to-drain of the nMOS transistor 14a for Y selection in the Y selector circuit 13 is connected between one bit line BL and one data line DL, and one Y address signal of differential Y address signals is supplied to a gate electrode of the nMOS transistor 14a. A source and a drain of the dummy nMOS transistor 14b configured to be paired with the nMOS transistor 14a are connected to a ground, and the other Y address signal of the differential Y address signals is supplied to a gate electrode of the nMOS transistor 14b.

A source-to-drain of the nMOS transistor 15a for Y selection in the Y selector circuit 13 is connected between the other bit line /BL and the other data line /DL, and one Y address signal of differential Y address signals is supplied to a gate electrode of the nMOS transistor 15a. A source and a drain of the dummy nMOS transistor 15b configured to be paired with the nMOS transistor 15a are connected to a ground, and the other Y address signal of the differential Y address signals is supplied to a gate electrode of the nMOS transistor 15b.

A sense amplifier circuit 16 is connected to the differential bit lines BL and /BL. The sense amplifier circuit 16 includes two CMOS inverter circuits 17a and 17b which are respectively configured by an nMOS transistor and a pMOS transistor, and input and output nodes of which are cross-connected with each other to configure a flip flop circuit.

The one CMOS inverter circuit 17a is configured by a pMOS transistor 18a whose source is connected to a power line SNL to which a power supply voltage at a high potential side is to be transmitted; and an nMOS transistor 19a whose drain is connected to a drain of the pMOS transistor 18a and whose source is connected to a power supply line SPL to which a voltage at a low potential side is to be transmitted. The gate electrodes of both of the transistors 18a and 19a are connected in common, and its gate common connection node is connected to the bit line /BL.

The other CMOS inverter circuit 17b has a pMOS transistor 18b and an nMOS transistor 19b configured to be paired with the pMOS transistor 18a and the nMOS transistor 19a in the one CMOS inverter circuit 17a, respectively. A source of the PMOS transistor 18b is connected to the power supply line SNL. A drain of the nMOS transistor 19b is connected to a drain of the pMOS transistor 18b, and a source of the nMOS transistor 19b is connected to the power supply line SPL. Gate electrodes of both of the transistors 18b and 19b are connected in common, and its gate common connection node is connected to the bit line BL.

In FIG. 1, two pairs of paired transistors with each other enclosed in the dashed line are formed so as to be adjacent to each other in a same well region. That is, the nMOS transistors 11a and 11b in each memory cell MC are formed so as to be adjacent to each other in a p-well region. The nMOS transistors 14a and 14b in the Y selector circuit 13 are formed so as to be adjacent to each other in a same p-well region. The nMOS transistors 15a and 15b in the Y selector 13 are formed so as to be adjacent to each other in a same p-well region. The pMOS transistors 18a and 18b in the sense amplifier circuit 16 are formed so as to be adjacent to each other in a same n-well region. Similarly, the nMOS transistors 19a and 19b in the sense amplifier circuit 16 are formed so as to be adjacent to each other in a same p-well region. A ground voltage is supplied to each of the above p-well regions, and a power supply voltage of a positive polarity is supplied to the n-well region.

The above-described differential word lines WL and /WL, differential bit lines BL and /BL, and differential data lines DL and /DL configure differential signal paired lines, respectively, and the above power supply line SNL and power supply line SPL configure power supply/ground paired lines. The voltage at the low potential side to be transmitted to the power supply line SPL may be a voltage equal to the ground voltage.

FIG. 1 shows only a partial configuration of a DRAM. This configuration is merely provided as an example. What is common to all circuits in the DRAM, for example, the circuits including a control circuit 20 in FIG. 1 for controlling operations of the memory cells MC and sense amplifier 16 is that paired transistors operating in a differential manner are formed in a same well region; all signal lines are differential signal paired lines; and power supply lines are composed of power supply/ground paired lines. The above control circuit 20 includes, for example, a row decoder, a column decoder, and the like.

As described previously, signal energy (total amount of charge) flowing through a word line and a bit line is lost in memory cells, whereby an RC delay occurs, and a high speed operation is inhibited. In order to prevent this situation, a charge in a previous state of transistors in the memory cells may be reutilized. When transistors making a switching operation in a differential manner are formed to be allocated in proximity to each other in a same well region, the paired transistors in the well region can be charge-exchanged with each other. Hereinafter, this is referred to as a charge exchange effect. In this case, in view of the word line and the bit line, the paired transistors are increased to ½ in capacitance in the worst case regardless of whether the transistors are active or inactive, and the capacitance becomes 0 in an optimal structure, i.e., enters substantially a no-load state.

When transmission lines are wired, the transmission lines enable high speed signal transmission by only an optical transmission delay. Moreover, because no energy attenuation occurs, an accumulated charge amount of a capacitor for data storage provided in memory cells can be sufficiently sensed by a sense amplifier circuit even if the accumulated charge amount is 1/n of a conventional one. The sense amplifier circuit is also provided as a high speed sense amplifier circuit with high sensitivity because a capacitance at the time of transition cannot be identified.

Figure 2:
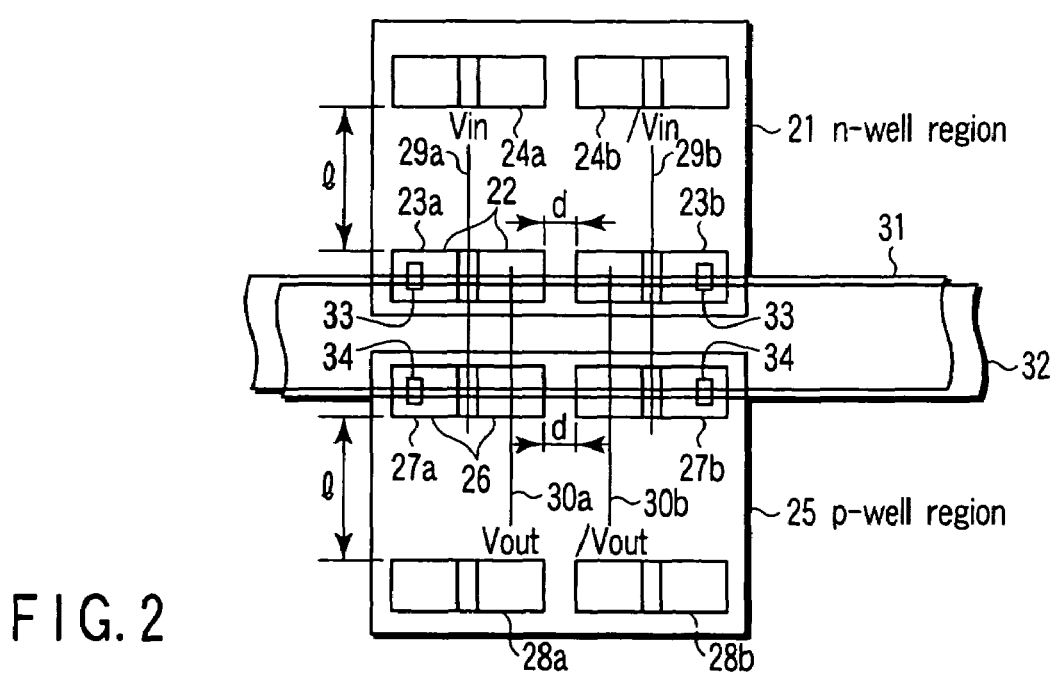
FIG. 2 is a plan view showing a pattern of an inverter circuit using pared transistors.

A pattern plan view in FIG. 2 shows an example in which an example of paired transistors commonly using a well region is represented by a simple inverter circuit in order to attain the above-described charge exchange effect. In the DRAM shown in FIG. 1, a constant current transistor which does not make a switching operation but operates in a direct current manner may not be exceptionally paired. However, as shown in the Y selector circuit 13, the dummy transistors 14b and 15b whose source and drain are not connected to a data line or a bit line are provided with respect to the Y selector transistors 14a and 15a connected between the data line and the bit line, whereby paired transistors operating in a differential manner may be configured.

In FIG. 2, a plurality of p-type diffusion layers 22 serving as source and drain regions of a PMOS transistor are formed in an n-ell region 21. A gate electrode is formed on a line region between a pair of p-type diffusion layers 22. A pair of pMOS transistors 23a and 23b configured to be paired transistors are formed with a planar distance "d" such that charge exchange is carried out and a high speed state transition is accelerated at the time of transition of a gate control signal to be supplied to the paired transistors. A maximum value dmax of the planar distance "d" is given by: dmax=trµE=0.35f µE when the mobility of charges in the n-well region 21 is µ (cm²/Sv), an electric field intensity between line regions of the paired transistors (pMOS transistors 23a and 23b) is E (V/cm), a transition time of the gate control signal (rise time or fall time) is tr (s), and a frequency of the gate control signal is f (1/s).

A pair of pMOS transistors 24a and 24b configured to be paired transistors other than the above pMOS transistors 23a and 23b are formed in the n-well region 21. The paired transistors composed of the transistors 24a and 24b, like the paired transistors composed of the transistors 23a and 23b, are formed with a planer distance "d" such that charge exchange is mutually carried out and high speed state transition is accelerated at the time of transition of a gate control signal to be supplied to the paired transistors. In addition, a planer distance "1" between the paired transistors 23a, 23b and 24a, 24b is set to be equal to or greater than, for example, 5d (1>5d) which is a distance such that no charge exchange is substantially carried out between both the paired transistors.

A plurality of n-type diffusion layers 26 serving as source and drain regions of an n-MOS transistor are formed in a p-well region 25. A gate electrode is formed on a line region between a pair of n-type diffusion layers 26. A pair of nMOS transistors 27a and 27b configured to be paired transistors are formed with a planar distance "d" such that charge exchange is mutually carried out and high speed state transition is accelerated at the time of transition of a gate control signal to be supplied to the paired transistors. A maximum value dmax of the planar distance "d" is given by the above formula: dmax=trµE=0.35fµE.

A pair of nMOS transistors 28a and 28b configured to be paired transistors other than the above nMOS transistors 27a and 27b are formed in the p-well region 25. The paired transistors composed of the transistors 28a and 28b, like the paired transistors composed of the transistors 27a and 27b, are formed with a planer distance "d" such that charge exchange is mutually carried out and high speed state transition is accelerated at the time of transition of a gate control signal to be supplied to the paired transistors. In addition, a planer distance "1" between the paired transistors 27a, 27b and 28a, 28b is set to be equal to or greater than, for example, 5d (1>5d) which is a distance such that no charge exchange is substantially carried out between both the paired transistors.

Gate electrodes of the pMOS transistor 23a and nMOS transistor 27a are connected to each other by a line 29a, and the p-type diffusion layer 22 and the n-type type diffusion layer 26 serving as drain regions are connected to each other by an output line 30a. Both the transistors 23a and 27a each configure an inverter circuit. Gate electrodes of the pMOS transistor 23b and nMOS transistor 27b configured to be paired with the pMOS transistor 23a and nMOS transistor 27a, respectively, are connected with each other by a line 29b, and the p-type diffusion layer 22 and the n-type diffusion layer 26 serving as drain regions are connected to each other by an output line 30b. Both the transistors 23b and 27b each also configure an inverter circuit.

Gate lines 29a and 29b configure differential signal paired lines. Input signals Vin and /Vin for operating the transistors 23a and 27a in a differential manner are transmitted to the differential signal paired lines. Similarly, output lines 30a and 30b configure differential signal paired lines. Differential signals Vout and /Vout outputted from both the inverter circuits are transmitted to the differential signal paired lines.

To supply a power supply voltage and an earth voltage (ground voltage) to both the CMOS inverter circuits, power supply/ground paired lines each configured by a power supply line 31 and a ground line 32 are formed across the above n-well region 21 and p-well region 25. Two p-type diffusion layers 22 serving as source regions of the pMOS transistors 23a and 23b are connected to the power supply line 31 via two power supply contacts 33, and two n-type diffusion layers 26 serving source regions of the nMOS transistors 27a and 27b are connected to the ground line 32 via two ground contacts 34.

As described above, the power supply and ground lines configure paired lines, and its characteristic impedance is set to be equal to or smaller than a parallel total value of load impedances of transistors dangling in parallel to these paired lines. More specifically, a characteristic impedance Z of the power supply/ground paired lines is set to, for example, 5Ω.

In addition, with respect to a plurality of transistors configuring the control circuit 20 for controlling operations of the memory cells MC and sense amplifier circuit 16 as well, two transistors of the same line type are formed so as to be adjacent to each other in a same well region, and are formed as paired transistors operating in a differential manner.

Figure 3:
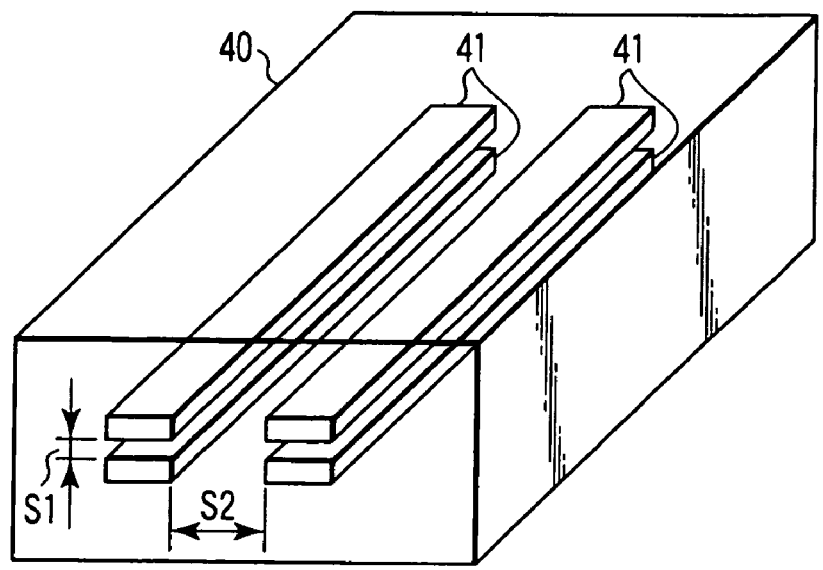
FIG. 3 is a perspective cross section showing an example of differential signal paired lines in FIG. 1.
Figure 4:
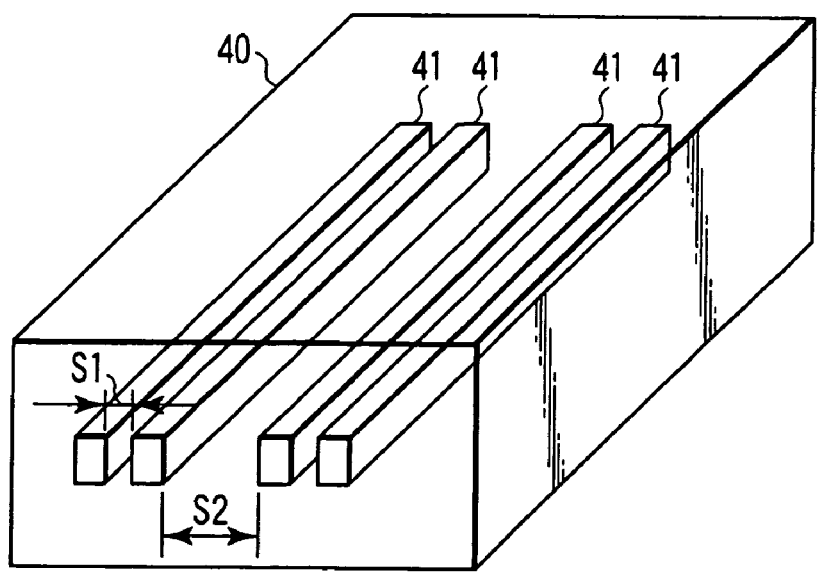
FIG. 4 is a perspective cross section showing another example of the differential signal paired lines in FIG. 1.

FIGS. 3 and 4 each show an example of a cross section structure of differential signal paired lines configured by the differential word lines WL and /WL, the differential bit lines BL and /BL, and the differential data lines DL and /DL shown in FIG. 1. The differential signal paired lines shown in FIG. 3 are referred to as stacked paired lines. The stacked paired lines are configured by a pair of lines 41 which overlap each other in a vertical direction and also extend so as to be in parallel to each other in a homogeneous insulating layer 40.

The differential signal paired lines shown in FIG. 4 are referred to as paired coplanar lines. The paired coplanar lines are composed of a pair of lines 41 which overlap each other in a horizontal direction and also extend so as to be parallel to each other in a homogeneous insulating layer 40.

In FIGS. 3 and 4, assuming that a space between the pair of lines 41 is s1, and a space between the adjacent paired lines is s2, a plurality of differential signal paired lines are allocated so as to be 2s1≦s2.

Here, the differential signal paired lines composed of the differential word lines WL, /WL, differential bit lines BL, /BL, and differential data lines DL, /DL are set in line dimensions so that their characteristic impedance Z is maintained at a value ranging from 50Ω to 200Ω, preferably, 10Ω.

In the meantime, the largest reason why a transistor does not operate at a high speed is that it takes long for the transistor to discharge an accumulated charge which exists immediately before state transition, and then, include the accumulated charge in accumulated charge distribution following a new state. With respect to a power supply ground, the bypass capacitor is essentially passive, and does not actively help charge supply and discharge of a transistor making an active change even if a bypass capacitor is supported in a chip. A momentary current increases, whereby a fall of a power supply voltage and a rise of a ground level occur, and the momentary current is limited. This problem will be described with reference to a model of an nMOS transistor.

FIG. 5A shows a sectional structure of an nMOS transistor and FIG. 5B shows a symbol of the same transistor. In the nMOS transistor, a source S and a drain D are formed on a surface region of a substrate, and a gate G is formed on the substrate between the source and drain via a gate insulating film.

Now, when a case in which all the voltages of the gate, source, and drain are equal to each other is defined as a reference, a line immediately beneath the gate insulating film is inverted, and an inversion layer is formed when a positive potential is applied to the gate. Charges are opposed to each other between a gate potential and an inversion layer potential, and a parasitic capacitance Cox is generated between the gate and the inversion layer. In this case, the charge of the inversion layer is an electron. A depletion layer is generated at the lower part of the inversion layer, and charges are opposed to each other in this depletion layer as well. Thus, a parasitic capacitance CGsub' is generated between the inversion layer and the depletion layer. A parasitic capacitance CGsub originally exists between the gate and the substrate.

In addition, a parasitic capacitance CGS exists between the gate and the source, and a parasitic capacitance CGD exists between the gate and the drain, respectively. A parasitic capacitance (source depletion layer capacitance) CJS exists between the source and the substrate, and a parasitic capacitance (drain depletion capacitance) CJD exists between the drain and the substance, respectively. Further, CD shown in FIG. 5B is a parasitic capacitance between the drain and the ground, and CG is a parasitic capacitance between the gate and the ground.

It should be noted in particular that, when a pulse shaped voltage VG is applied to a gate electrode, and then, pinch-off occurs, namely, when a drain current reaches a steady state, a drain voltage VD is lowered to close to a substantial potential, so that a drain depletion layer narrows and a value of the parasitic capacitance CJD increases. The parasitic capacitances CD and CG can take a variety of values in response to a range of values of the gate voltage VG, as shown in FIG. 6.

A case in which the gate voltage VG is lower than a threshold voltage VTH of the nMOS transistor is referred to as a depletion layer state. When this depletion layer state is established, CG=CGS+CGSub+CGD and CD=CDsub+CJD are obtained, and a value of CGsub decreases with an increase of VG. In addition, since a bias is large and the thickness of a depletion layer is large, a value of CD is small.

A case in which the gate voltage VG exceeds VTH and is lower than VDsat is referred to as a saturation state. VDsat is a value of VD when a saturation current flows. When this saturation state is established, CG=CGS+CGsub+CGS'+ CGD and CD=CDsub+CJD are obtained, a value of CGsub decreases with an increase of VG while a value of CGS' increases.

A state in which the gate voltage VG exceeds VDsat is referred to as a non-saturation state. When this non-saturation state is established, CG=CGS+CGS'+CGD=COX and CD=CJD are obtained, and a value of CJD decreases with an increase of VG. In this way, a value of an effective capacitance of the MOS transistor changes with a change of the gate voltage VG. Then, all the effective capacitances are referred to as Cmos.

FIG. 7 shows voltage characteristics of the effective capacitance Cmos of the MOS transistor. In the figure, the vertical axis indicates a relative value (relative capacitance) of the effective capacitance Cmos, and the horizontal axis indicates a gate-to-source voltage VGS. A change of the effective capacitance Cmos of the MOS transistor can be considered by dividing it into a strong inversion layer range, an intermediate inversion layer range, a weak inversion layer range, a depletion layer range, and an accumulation layer range. As shown in characteristic A in FIG. 7, a value of the effective capacitance Cmos has a minimum point. At this minimum point, a case in which the gate capacitance CG is more dominant than the drain capacitance CD is a case in which an inversion layer disappears and only a depletion layer is generated. However, a case in which the drain capacitance CD is dominant may also be a case in which a change occurs as shown in characteristic B in FIG. 7.

In this manner, the MOS transistor can be regarded as a variable capacitance element depending on a voltage. Among them, a primary value of the capacitance Cox is given by Cox=∈oxS/tox. In the formula, ∈ox is a dielectric constant of a gate insulating film, S is a line area, and tox is film thickness of the gate insulating film. The drain depletion capacitance CJD is given by the formula below:

$$C_{JD} = \sqrt{\frac{q\kappa_{si}\varepsilon_0 N_A N_D}{2(N_A + N_D)(\phi - V)}} \qquad (1)$$

where κsi is a specific dielectric constant of Si, NA and ND are concentrations of an acceptor and a donor, and ϕ is a diffusion voltage.

When a minimum value of Cmos in FIG. 7 is defined as Cmin, a charge amount of Qtran=2Vswing (Cmin) must be implanted from a power supply by inverting (Vswing) the gate voltage CG. In order to invert a charge, a coefficient indicating x2 is assigned. This coefficient can be energy for operating oneself regardless of an output charge of the MOS transistor.

Now, assuming that a signal voltage is Vswing=1 V and Cmin=5 fF, Qtran=5 fC is obtained. Assuming that a transition time of a control signal inputted to the gate (rise time or fall time) is 25 ps, Itran=0.2 mA is redundantly required for driving the transistor. Every signal transition this energy must be absorbed or discharged momentarily. This also applied to the PMOS transistor. That is, in a circuit in which a number of MOS transistors are integrated, the transistor cannot function well if the state of power supply/ground is slightly poor.

A power supply/ground voltage is static, and, when a current 0.2 mA flows momentarily, a fall of a power supply voltage or a rise of a ground level occurs due to influence of a parasitic inductance which exists in that line. Assuming that a value of the parasitic inductance is 1 nH, a voltage fluctuation AV is obtained as follows:

$$\Delta V=(di/dt)L=(0.2 \text{ mA}/25 \text{ ps})1 \text{ nH}=8 \text{ mV} \qquad (2)$$

That is, when 10 MOS transistors make a switching operation at the same time, a voltage fluctuation of 80 mA occurs in power supply line or ground line.

In the meantime, in a DRAM shown in FIG. 1, a transistor making a switching operation is formed in a same well region as one of paired transistors together with another transistor operating in a differential manner. When the paired transistors formed in the same well region operate in a differential manner, the charge accumulated in the effective capacitance of one of the paired transistors moves to the effective capacitance of the other one of the paired transistors without escaping into power supply and ground lines, and contributes to charge the effective capacitance of the other transistor.

Now, an operation of the above paired transistors will be described with reference to a circuit model as shown in FIG. 8. In FIGS. 8A, 8B and 8C, paired transistors are expressed as switches SW1 and SW2, and the previously described effective capacitances (Cmos) which exist in the transistors are expressed as C1 and C2, respectively.

FIG. 8A shows an initial state before paired transistors make a switching operation. In this initial state, the switch SW1 is closed (in ON state), and the switch SW2 is open (in OFF state). At this time, a charge is accumulated in the effective capacitance C1.

FIG. 8B shows a transition state when paired transistors make a switching operation. In this transition state, as shown at a boundary between the weak inversion layer range and the intermediate inversion layer range in FIG. 7, the values of the effective capacitances C1 and C2 are obtained as a minimum value Cmin of Cmos (substantially half of Cmos). By reducing this effective capacitance to be halved (½), a charge is forcibly discharged from the effective capacitance C1. The discharged charge moves to the other effective capacitance C2, and is accumulated therein. In this case, the charge supplied to the other effective capacitance C2 is assumed to be, for example, a negative charge (electron) as illustrated. As described previously, assuming that Cmin=2.5 fF, the charge amount of 2.5 fC is forcibly discharged from the effective capacitance C1. The negative charge discharged from the effective capacitance C1 is preferentially received by the effective capacitance C2 which exists in a same space, namely, in a same well region.

FIG. 8C shows a state established after inversion, i.e., after paired transistors have made a switching operation. In this state, the switch SW1 is open (in OFF state) and the switch SW2 is closed (in ON state). At this time, in the effective capacitance C1, a positive charge (hole) set free when an electric field is eliminated can also move to the effective capacitance C2 more preferentially than a charge included in a power supply Vdd which exists via an inductance. A time interval required for movement of both of the positive and negative charges becomes equal to or smaller than 1 ps when the time interval is calculated by using the mobility of charges. This transition time interval is sufficient for such movement.

The above time interval equal to or smaller than 1 ps can be calculated as follows. Here, the hole is slower than electrons in movement speed, and thus, the time interval is calculated by using the hole. The hole mobility is $4 \times 10^2$ (cm$^2$/vs). Assume that a temperature is 300 k and a carrier concentration ranges from $10^{14}$ to $10^{15}$ (cm$^{-3}$). Now, assuming that Vdd=1.8 V, the drift diffusion speed is obtained as D=$7.2 \times 10^2$ (cm$^2$/s). Assuming the maximum dimensions of carrier movement in the same well region is 10 μm, 0.001 cm=$\sqrt{Dt}$=$\sqrt{7.2 \times 10^2 \cdot t}$ is established, and t=$1.4 \times 10^{-9}$ (s)=1.4 ns is obtained. In electrons, this time interval is obtained as about 140 ps. Assuming that the maximum movement distance of charges is 1 μm, the above time interval is increased by one digit, and is obtained as a time interval in a GHz bandwidth. That is, more advantageous effect can be attained by reducing a movement distance of charges in the well region.

Here, the paired transistors formed in the same well region are formed with a planar distance such that the exchange of charges as described above are efficiently carried out at the time of switching and a high speed state transition is accelerated ("d" in FIG. 2). The maximum value dmax of this planar distance "d" is given by dmax=trμE=0.35fμE when the mobility of charges in the well region is μ(cm$^2$/Sv), an electric field intensity between line regions of the paired transistors is E (V/cm), a transition time (rise time or fall time) of a control signal to be inputted to a gate of the transistor is tr(s), and a frequency of the control signal is f (1/s).

Now, the movement of charges as described above in paired transistors will be described with reference to a cross section of an actual circuit.

Figure 9:
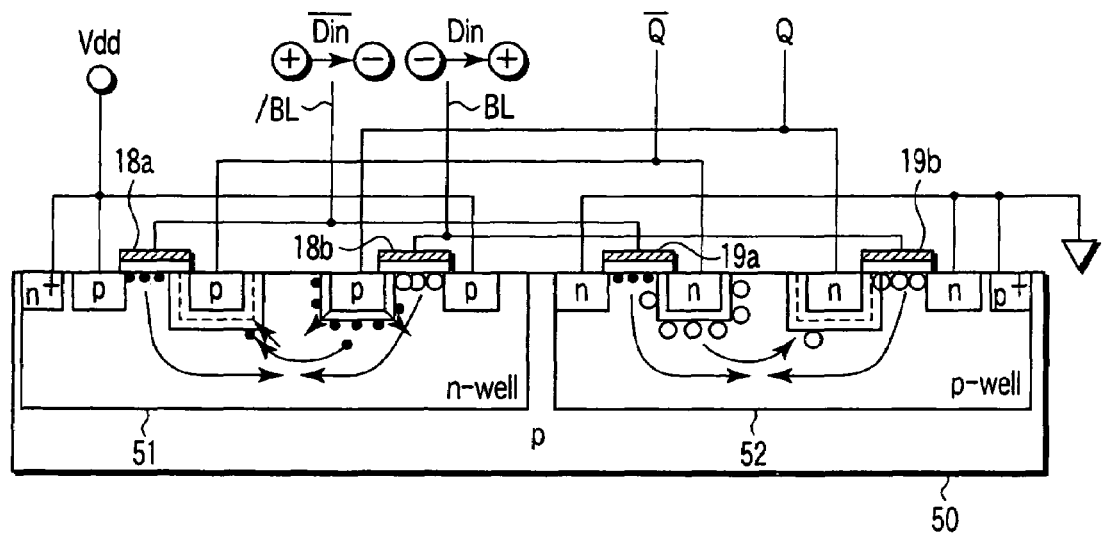
FIG. 9 is a sectional view showing an element structure of a sense amplifier circuit which is an example of a circuit using paired transistors.

FIG. 9 shows a sectional structure of the sense amplifier circuit 16 shown in FIG. 1 as an example of a circuit using paired transistors. An n-well region 51 and a p-well region 52 are formed on a p-type substrate 50. Two pMOS transistors 18a and 18b in the sense amplifier 16 shown in FIG. 1 are formed in the n-well region 51, and two nMOS transistors 19a and 19b in the sense amplifier 16 are formed in the p-well region 52.

A power supply voltage Vdd at a high potential side to which a power supply line SNL is to be transmitted is supplied to a source of each of the pMOS transistors 18a and 18b. A power supply voltage at a low potential side to which a power supply line SPL is to be transmitted, namely, a ground voltage is supplied to a source of each of the nMOS transistors 19a and 19b. Gates of the pMOS transistor 18a and the nMOS transistor 19a are connected in common to one bit line /BL. An input signal /Din of one of differential signals is supplied to the bit line /BL. Gates of the pMOS transistor 18b and the nMOS transistor 19b are connected in common to the other bit line BL. An input signal Din of the other one of the differential signals is supplied to the bit line BL.

Here, two pMOS transistors 18a and 18b formed in the same n-well region 51 has the same dimensions and structure, and are formed with a planar distance "d" such that exchange of charges is mutually carried out and a high speed state transition is accelerated at the time of transition of the signals Din and /Din supplied to both the transistors. Similarly, two nMOS transistors 19a and 19b formed in the same p-well region 52 also have the same dimensions and structure, and are formed with a planar distance "d" such that exchange of charges is mutually carried out and a high speed state transition is accelerated at the time of transition of the signals Din and /Din supplied to both the transistors.

In this manner, each of the paired transistors in the sense amplifier shown in FIG. 9 makes operation as described in FIGS. 8A, 8B, and 8C. Namely, the effective capacitance of one transistor configured to be paired transistors is reduced to be halved, whereby a redundant charge is charged by the effective capacitance of the other transistor by pup-up/pup-down operation, and the remaining halved charge is also charged by the effective capacitance of the other transistor by means of a free carrier which is closer than a power supply in distance. That is, this sense amplifier circuit has a substantially small capacitance and can operate at a high speed. Similarly, a transfer gate in memory cells having paired transistors has a substantially small capacitance, and operates at a high speed.

FIG. 9 shows an appearance when charges move in the case where one signal Din of the differential signals Din and /Din is switched (changed) from a low level (−) to a high level (+) while the other signal /Din is switched (changed) from a high level (+) to a low level (−). Referring to the two pMOS transistors in the n-well region 51, a depletion layer around the p-type drain diffusion layer is reduced in one pMOS transistor 18a, and conversely, a depletion layer around the p-type drain diffusion layer expands in the other PMOS transistor 18b, and then, a carrier moves between these two pMOS transistors 18a and 18b. This also applies to the two nMOS transistors in the p-well region 52.

Figure 10:
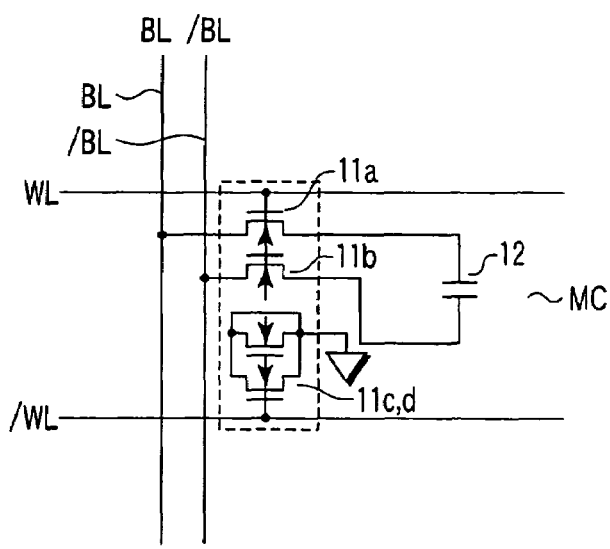
FIG. 10 is a circuit view showing another example of a configuration of memory cells of the DRAM according to the first embodiment.

In the meantime, in the DRAM of FIG. 1, a description has been given with respect to a case in which memory cells MC are composed of nMOS transistors 11a, 11b which are a pair of paired transistors and a data storage capacitor 12. However, the present invention is not limited thereto. As shown in FIG. 10, memory cells MC may be composed of four nMOS transistors 11a, 11b, 11c, 11d which are two pairs of paired transistors for a transfer gate and one capacitor 12.

That is, the gate electrodes of two nMOS transistors 11a and 11b configuring one paired transistor are connected in common to one word line WL of the differential word lines, a drain is connected to one of the differential bit lines and the other bit line BL, /BL, and the capacitor 12 is connected between the sources of the two nMOS transistors 11a and 11b.

The gate electrodes of two nMOS transistors 11c and 11d configuring the other paired transistor are connected in common to the other word line /WL of the differential word lines, and a drain and a source are connected to a ground altogether.

Figure 11:
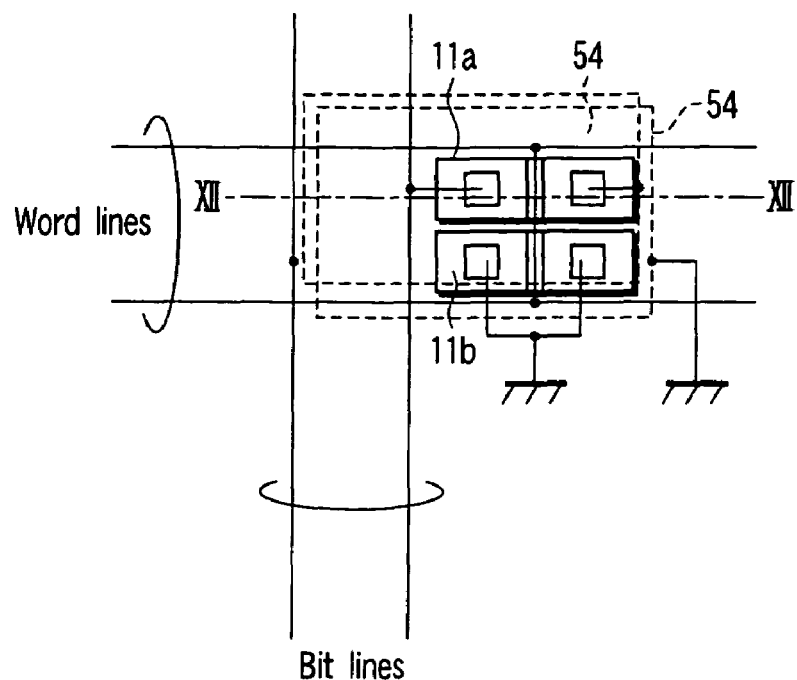
FIG. 11 is a plan view showing a capacitor shown in FIG. 1 together with an nMOS transistor for a transfer gate.
Figure 12:
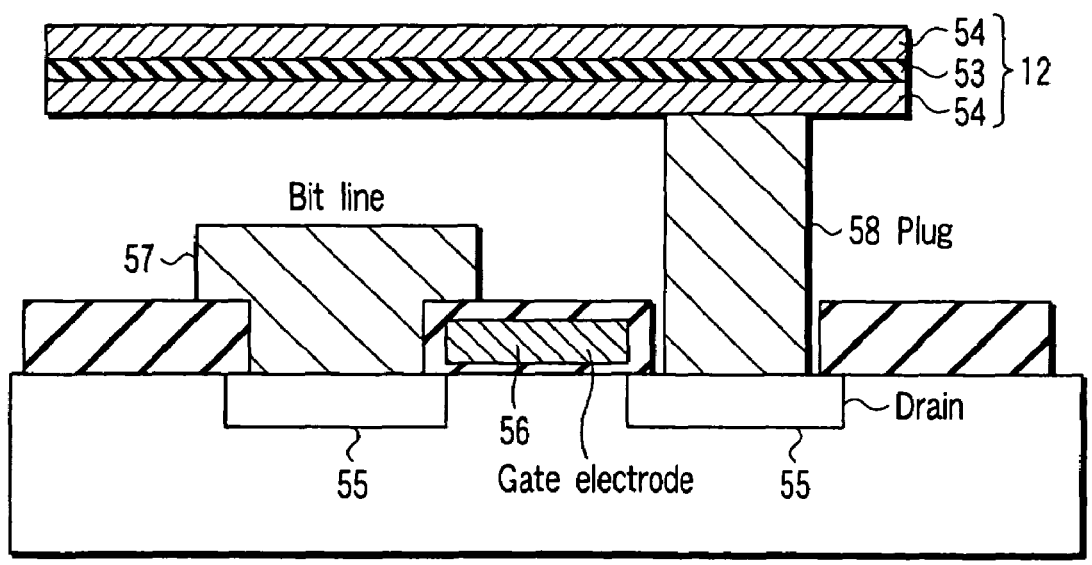
FIG. 12 is a sectional view of the capacitor shown in FIG. 11.

FIG. 11 is a plan view showing the capacitor 12 shown in FIG. 1 together with nMOS transistors 11a and 11b for a transfer gate. FIG. 12 is a sectional view taken along the line XII-XII shown in FIG. 11. As shown in FIG. 12, the capacitor 12 has a pair of metal electrodes 54 opposed while sandwiching an insulator 53 made of a material having High-k (high dielectric constant), for example, $HfO_2$, $Ta_2O_5$, $La_2O_3$, $Pt_2O_3$, $CeO_2$ or the like. As shown in FIG. 11, a pair of contact portions connecting the pair of metal electrodes 54, the nMOS transistor 11a, and the ground is let out from the same site together with the pair of metal electrodes 54. That is, a capacitor itself has a transmission line structure, whereby the charge in the capacitor can be charged and discharged at a high speed, making it possible to achieve speedy operation of memory cells.

In FIG. 12, reference numeral 55 denotes a p-type diffusion layer serving as a source or a drain of an nMOS transistor; reference numeral 56 denotes a gate electrode; reference numeral 57 denotes a bit line; and reference numeral 58 denotes a plug for connecting a capacitor and a drain with each other.

Now, the capacitance of the capacitor 12 is calculated here. Assuming that a capacitor area is S, a dielectric constant of the insulator 53 is "k", and the thickness of the insulator 53 is "t", a capacitance Cs is given by Cs=kS/t. The capacitor area in the case of using a 0.18 μm process is about 0.2 μm$^2$, and thus, S=0.18 μm$^2$ is defined, for example. When $HfO_2$ of t=10 nm and k=30 is used as the insulator 53, the capacitance Cs is obtained as follows. Al was employed for the metal electrodes 54. Of course, another metal may be used as an electrode material.

$$Cs = 30 \times 8.84 \times 10^{-12} \times 0.18 \times 10^{-12}/10 \times 10^{-9} \ (F) \approx 5 \ (fF) \quad (3)$$

In the formula, assuming that an operation start voltage of the sense amplifier 16 is ΔV, the capacitance of each bit line is Cb=150 fF, and a power supply voltage is Vdd=2.5V, ΔV=(Vdd/2)(Cs/Cs+Cb)=41 mV is obtained.

The sensing capability of the sense amplifier circuit is about 200 mV in the 0.18 μm process, in general. The operating start voltage ΔV (41 mV) as described above is equal to or smaller than the sensing capability, and an operable sense amplifier circuit cannot be designed. However, bit lines are configured as transmission line type differential bit lines, and the line capacitance is obtained as a characteristic impedance while it cannot be substantially identified. In addition, since the drain capacitance leading to many other transfer gates is also substantially ½ in charge exchange effect, Cb is about 30 fF, and 150 mV can be established as ΔV. Moreover, the sense amplifier circuit 16 itself is obtained as a charge exchange circuit using paired transistors, and the sensitivity is improved, thus enabling sufficient sensing operation even when ΔV is 150 mV.

Of course, when a cell area is reduced by further downsizing, lamination may be considered in the thickness direction of the capacitor, and a degree of structural freedom can be maintained.

In summary, the above-described DRAM has the following five features:

(1) transistors making a switching operation configure paired transistors operating in a differential manner;

(2) the paired transistors of (1) are formed so as to be adjacent to each other in a same well region, and charges accumulated by the operation are exchanged with each other;

(3) lines (such as word line, bit line, and data line) for transmitting a differential signal are formed as paired lines having a specific impedance (z=100Ω);

(4) power supply and ground lines are paired lines, and its characteristic impedance is set to be equal to or smaller than a parallel total value of load impedances of transistors dangling in parallel; and (5) a capacitor in a memory cell itself is provided as a transmission line structure, and the charges in the capacitor can be charged and discharged at a high speed.

The DRAM of FIG. 1 has the above five features, whereby high speed operation can be achieved. Even if the elements in FIG. 1 are manufactured by using a general MOS circuit process, i.e., a process in which the minimum dimensions of elements range from 0.35 μm to 0.18 μm, a switching operation at a frequency of several GHz bandwidths can be secured. A generally encountered RF delay problem can be almost avoided even by using an aluminum line equivalent to this process.

When transistors are provided as differential paired transistors, the number of transistors increases, and concurrently, the number of lines such as word lines also increases. However, more advantageous effects such as achievement of high speed operation and low power consumption can be attained. In addition, conventionally, there has been a need for additionally providing a variety of auxiliary circuits in an add-on manner in order to improve characteristics. However, in the DRAM of FIG. 1, there is almost no need for providing such an auxiliary circuit, and the DRAM can be composed of circuits based on a principle of operation as sown in a general textbook. Therefore, an increased number of transistors caused by the paired transistor configuration can be almost eliminated.

Second Embodiment

Now, a case in which the present invention is applied to an SRAM will be described here.

Figure 13:
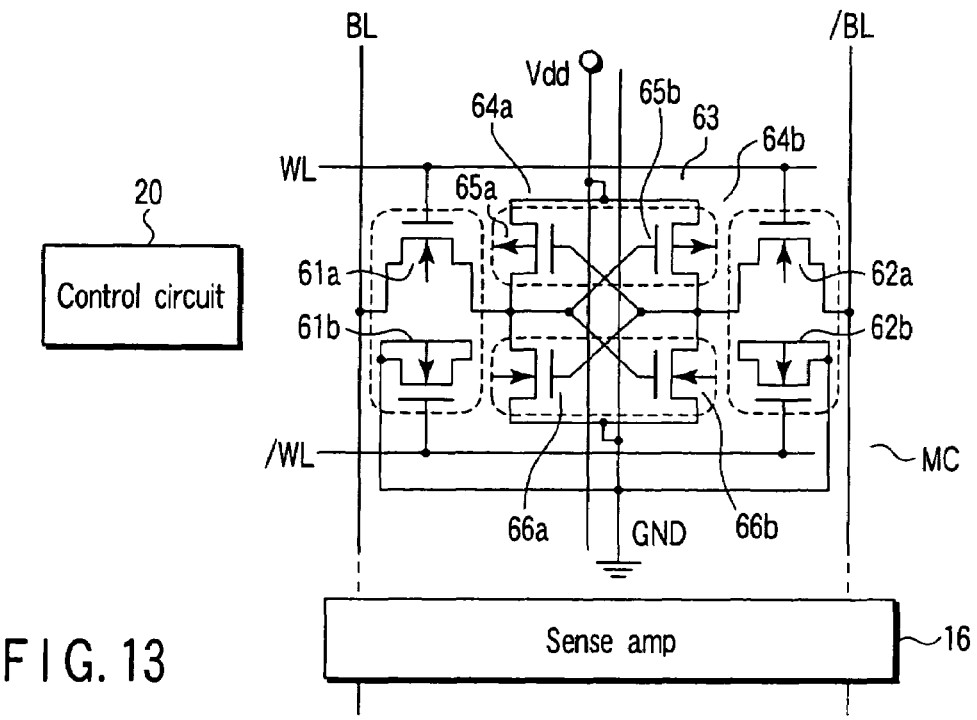
FIG. 13 is a circuit diagram showing an SRAM according to a second embodiment.

FIG. 13 shows a circuit configuration of the SRAM according to the second embodiment. In the figure, WL and /WL denote differential word lines, and BL and /BL denote differential bit lines. Memory cells MC are allocated at cross points of the differential word lines WL, /WL and the differential bit lines BL, /BL. The memory cells MC are connected to the differential word lines WL, /WL and differential bit lines BL, /BL.

A plurality of differential word lines and a plurality of differential bit lines are provided in the SRAM according to the embodiment. Memory cells MC are allocated at cross points of the plurality of differential word lines WL, /WL and the plurality of differential bit lines BL, /BL, respectively. FIG. 13 shows only one memory cell from among them.

In addition to the memory cells MC, as is the case with the DRAM shown in FIG. 1, there are provided a control circuit 20 including a sense amplifier 16, for example, a row decoder and a column decoder.

In the second embodiment, the memory cells MC each include: an nMOS transistor 61a for a transfer gate; a dummy nMOS transistor 61b configured to be paired with the nMOS transistor 61a; an nMOS transistor 62a for a transfer gate; a dummy nMOS transistor 62b configured to be paired with the nMOS transistor 62a; and a flip flop circuit 63. The flip flop circuit 63 is connected to the nMOS transistors 61a and 62a for a transfer gate, and stores 1-bit data.

One of the source and drain of the nMOS transistor 61a for a transfer gate is connected to one bit line BL of the differential bit lines BL and /BL, the other one of the source and drain is connected to the flip flop circuit 63, and further, a gate electrode is connected to one word line WL of the differential word lines WL and /WL. The source and drain of the dummy nMOS transistor 61b configured to be paired with the above nMOS transistor 61a are connected to a ground altogether, and a gate electrode is connected to the other word line /WL of the differential word lines WL, /WL. Similarly, one of the source and drain of the nMOS transistor 62a for a transfer gate is connected to the other bit line /BL of the differential bit lines BL and /BL, the other one of the source and drain is connected to the flip flop circuit 63, and further, a gate electrode is connected to one word line WL of the differential word lines WL and /WL. The source and drain of the dummy nMOS transistor 62b configured to be paired with the above nMOS transistor 62a are connected to a ground altogether, and a gate electrode is connected to the other word line /WL of the differential word lines WL and /WL.

The flip flow circuit 63 includes two CMOS inverter circuits 64a and 64b which are respectively configured by an nMOS transistor and a pMOS transistor, and input and output nodes of which are cross-connected with each other.

One CMOS inverter circuit 64a is configured by: a pMOS transistor 65a whose source is connected to a power supply line to which a power supply voltage Vdd is to be transmitted; and an nMOS transistor 66a whose drain is connected to a drain of the PMOS transistor 65a and whose source is connected to a power supply line to which a power supply voltage (ground voltage GND) at a low potential side is to be transmitted. The gate electrodes of both the transistors 65a and 66a are connected in common, and this gate common connection node is connected to the other one of the source and drain of the nMOS transistor 62a for a transfer gate.

The other CMOS inverter circuit 64b has a pMOS transistor 65b and an nMOS transistor 66b to be paired with the pMOS transistor 65a and nMOS transistor 66a, respectively, in such one CMOS inverter circuit 64a. A source of the pMOS transistor 65b is connected to the above-described power supply line. A drain of the nMOS transistor 66b is connected to a drain of the pMOS transistor 65b, and a source of the nMOS transistor 66b is connected to a power supply line on a ground side. The gate electrodes of both the transistors 65b and 66b are connected in common, and this gate common connection node is connected to the other one of the source and drain of the nMOS transistor 62a for a transfer gate.

In FIG. 13, two pairs of paired transistors paired with each other enclosed in the dashed line are formed so as to be adjacent to each other in a same well region. That is, the nMOS transistors 61a and 61b are formed so as to be adjacent to each other in a same p-well region. The nMOS transistors 62a and 62b are formed so as to be adjacent to each other in a same p-well region. The pMOS transistors 65a and 65b are formed so as to be adjacent to each other in a same n-well region. The nMOS transistor 66a and 66b are formed so as to be adjacent to each other in a same p-well region. A ground voltage is supplied to each of the p-well regions, and a power supply voltage with a positive polarity is supplied to the n-well region.

As is the case with the DRAM according to the first embodiment, the differential word lines WL, /WL, the differential bit lines BL, /BL, and differential data lines (not shown) configure differential signal paired lines, respectively, as shown in FIG. 3 or 4. The dimensions of each line are set so that their characteristic impedance Z is obtained as a value ranging from 50Ω to 200Ω, preferably, 100 Ω. A pair of the above power supply lines configure power supply/ ground paired lines. The characteristic impedance of the power supply/ground paired lines is set to be equal to or smaller than a parallel total value of load impedances of transistors dangling in parallel. For example, the characteristic impedance Z of the power supply/ground paired lines is set to 5Ω.

FIG. 13 shows only a partial configuration of an SRAM. However, this configuration is merely provided as an example. What is common in all the circuits in the SRAM is that paired transistors operating in a differential manner are formed in a same well region, including the memory cells MC, the sense amplifier 16, and the control circuit 20; all the signal lines are differential signal paired lines; and power supply lines are composed of power supply paired lines.

In the SRAM according to the second embodiment, charge exchange can be carried out between paired transistors in the same well region, the reutilization of accumulated charges which have been wastefully consumed conventionally can be achieved, and high speed operation and low power consumption can be achieved from the same reason as in the case of the DRAM according to the first embodiment.

As is the case with the DRAM according to the first embodiment, a transmission line is employed as a line. When the transmission line is used, a signal delay is merely obtained as an optical transmission delay, and high speed signal transmission can be carried out.

Figure 14:
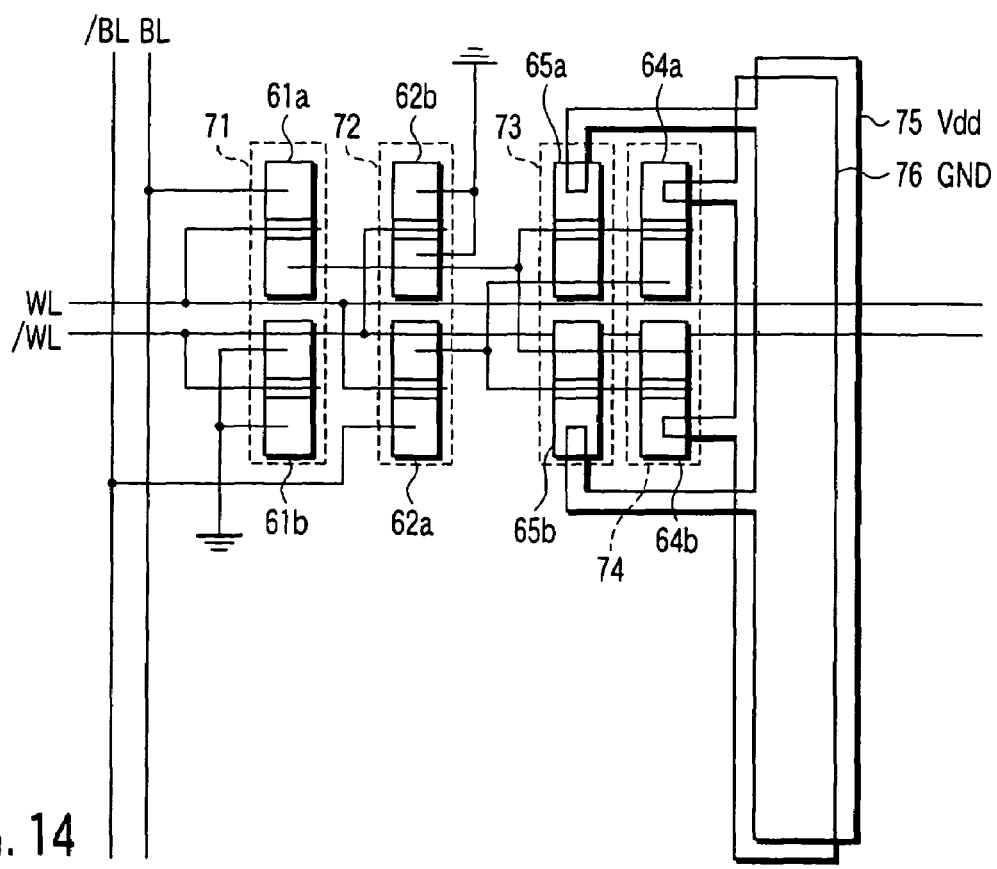
FIG. 14 is a plan view showing a pattern of memory cells shown in FIG. 13.

FIG. 14 is a plan view showing a pattern of memory cells shown in FIG. 13. In FIG. 14, like constituent elements corresponding to these in FIG. 13 are assigned by like reference numerals, and a duplicate description is omitted here. The nMOS transistors 61a and 61b configured to be paired transistors are formed so as to be adjacent to each other in a same p-well region 71. Then, both the transistors 61a and 61b are formed with a planar distance "d" such that charge exchange is mutually carried out and high speed state transition is accelerated at the time of transition of a gate control signal (signal of differential word line WL, /WL) to be supplied to the paired transistors. The nMOS transistors 62a and 62b configured to be paired transistors are formed so as to be adjacent to each other in a p-well region 73. Then, both the transistors 62a and 62b are formed with a planer distance "d" such that charge exchange is mutually carried out and high speed state transition is accelerated at the time of transition of a gate control signal (signal of differential word lines WL and /WL) to be supplied to the paired transistors. The pMOS transistors 65a and 65b configured to be paired transistors are formed so as to be adjacent to each other in a same n-well region 73. Then, both the transistors 65a and 65b are formed with a planar distance "d" such that charge exchange is mutually carried out and high speed state transition is accelerated at the time of transition of a gate control signal (signal of nMOS transistor 61a, 62a) to be supplied to the paired transistors. The p-MOS transistors 64a and 64b configured to paired transistors are formed so as to adjacent to each other in a same n-well region 74. Then, both the transistors 64a and 64b are formed with a planar distance "d" such that charge exchange is mutually carried out and high speed state transition is accelerated at the time of transition of a gate control signal (signal of nMOS transistor 61a, 62a) to be supplied to the paired transistors.

A maximum value dmax of the planar distance "d" is given by dmax=trμE=0.35fμE when the mobility of charges in the n-well region or p-well region is μ (cm²/Sv), an electric field intensity between line regions of paired transistors is E (V/cm), a transition time of a gate control signal (rise time or fall time) is tr (s), and a frequency of the gate control signal is f (1/s).

Power supply/ground paired lines configured by a power supply line 75 and a ground line 76 are formed in order to supply a power supply voltage and a ground voltage to both the above-described CMOS inverter circuits. Two p-type diffusion layers serving as source regions of the pMOS transistors 65a and 65b are connected to the power supply line 75 via two power supply contacts, and two n-type diffusion layers serving as source regions of the nMOS transistors 64a and 64b are connected to the ground line 76 via two ground contacts.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cells having at least a pair of paired transistors connected to a word line and a bit line, the paired transistors being formed in a same well region so as to be adjacent to each other, and operating in a differential manner; and
   a sense amplifier circuit having at least a pair of paired transistors connected to the bit line, the paired transistors being formed in a same well region so as to be adjacent to each other, and operating in a differential manner.

2. The semiconductor memory device according to claim 1, further comprising a control circuit which controls operations of the memory cells and sense amplifier circuit, wherein the control circuit has paired transistors formed in a same well region so as to be formed to each other and operating in a differential manner.

3. The semiconductor memory device according to claim 1, wherein the word line and bit line are composed of differential signal paired lines, respectively.

4. The semiconductor memory device according to claim 3, wherein a characteristic impedance of the differential signal paired lines is obtained as a value ranging from 50Ω to 200Ω.

5. The semiconductor memory device according to claim 1, wherein the memory cells each include paired transistors for a transfer gate and a capacitor connected to either one of the paired transistors, the capacitor storing data.

6. The semiconductor memory device according to claim 5, wherein the capacitor is connected between either one of the paired transistors for a transfer gate and a supply node of a reference potential.

7. The semiconductor memory device according to claim 5, wherein the capacitor has a structure in which an insulator made of a high k material is sandwiched between a pair of metal electrodes.

8. The semiconductor memory device according to claim 1, wherein the memory cells each include a first transistor for a transfer gate, a second transistor configured to be paired with the first transistor; and a flip flop circuit connected to the first transistor, the flip flop circuit storing data.

9. The semiconductor memory device according to claim 1, wherein the paired transistors are formed with a planer distance such that charge exchange is mutually carried out and high speed state transition is accelerated at the time of transition of a control signal to be supplied to the paired transistors.

10. The semiconductor memory device according to claim 9, wherein a maximum value dmax of the planar distance "d" is given by:

$$dmax = tr\ \mu E = 0.35\ f\ \mu E$$

where the mobility of charges in the well region is μ (cm²/Sv); an electric field intensity between line regions of the paired transistors is E (V/cm); a transition time of the control signal is tr (s); and a frequency of the control signal is f (1/s).

11. The semiconductor memory device according to claim 1, further comprising paired lines having a characteristic impedance equal to or smaller than an impedance obtained by make parallel to each other ON resistances of all transistors including a transistor in the sense amplifier circuit, the paired lines supplying power supply voltages at a high potential side and at a low potential side to the sense amplifier circuit.

* * * * *